(12) United States Patent
Ariyoshi et al.

(10) Patent No.: US 11,373,895 B2
(45) Date of Patent: Jun. 28, 2022

(54) ETCHING METHOD AND PLASMA PROCESSING APPARATUS

(71) Applicant: TOKYO ELECTRON LIMITED, Tokyo (JP)

(72) Inventors: Fumiaki Ariyoshi, Miyagi (JP); Masanori Asahara, Miyagi (JP); Shunsuke Aizawa, Miyagi (JP); Akihito Fushimi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/916,917

(22) Filed: Jun. 30, 2020

(65) Prior Publication Data
US 2021/0005503 A1  Jan. 7, 2021

(30) Foreign Application Priority Data

Jul. 1, 2019  (JP) .............................. JP2019-123131

(51) Int. Cl.
*H01J 37/32* (2006.01)
*H01L 21/687* (2006.01)
*H01L 21/67* (2006.01)
*H01L 21/3065* (2006.01)
*H01L 21/683* (2006.01)

(52) U.S. Cl.
CPC .. *H01L 21/68735* (2013.01); *H01J 37/32642* (2013.01); *H01L 21/3065* (2013.01); *H01L 21/67069* (2013.01); *H01J 2237/334* (2013.01); *H01L 21/6831* (2013.01)

(58) Field of Classification Search
CPC ........... H01J 2237/334; H01J 37/32642; H01J 37/32715; H01L 21/3065; H01L 21/67069; H01L 21/67109; H01L 21/6831; H01L 21/68735
USPC ....... 438/706, 710, 714; 156/345.14, 343.19, 156/345.3; 216/67
See application file for complete search history.

(56) References Cited

U.S. PATENT DOCUMENTS

| | | | | |
|---|---|---|---|---|
| 5,998,932 A | * | 12/1999 | Lenz | H01J 37/32642 315/111.21 |
| 10,685,862 B2 | * | 6/2020 | Rogers | H01J 37/32541 |
| 2002/0066531 A1 | * | 6/2002 | Ke | H01L 21/68721 156/345.1 |
| 2019/0006156 A1 | * | 1/2019 | Seo | H05H 1/46 |

FOREIGN PATENT DOCUMENTS

JP  2005-277369 A  10/2005

* cited by examiner

*Primary Examiner* — Lan Vinh
(74) *Attorney, Agent, or Firm* — Weihrouch IP

(57) ABSTRACT

An etching method is performed using a plasma processing apparatus that includes a processing chamber equipped with a support stage that accommodates a substrate, a first annular member disposed around the substrate and at least a part of the first annular member is disposed in a space between a lower surface of an outer peripheral portion of the substrate and an upper surface of the support stage, and a second annular member disposed outside the first annular member. The etching method includes adjusting a dielectric constant in the space using the first annular member in accordance with consumption of the second annular member; and etching the substrate.

20 Claims, 10 Drawing Sheets

(HIGH DIELECTRIC CONSTANT→
LOW DIELECTRIC CONSTANT)

(THICK → THIN)

INSTALL HIGH DIELECTRIC CONSTANT MATERIAL DECREASE IMPEDANCE

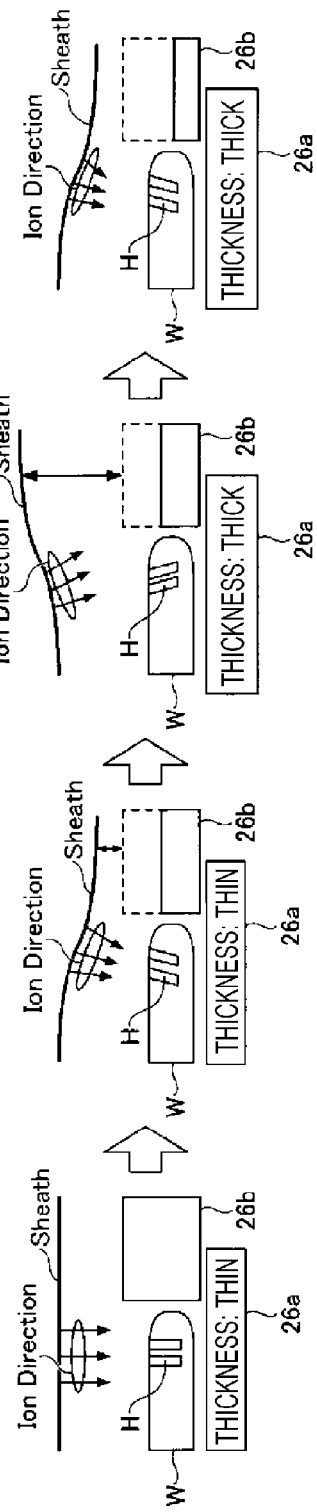

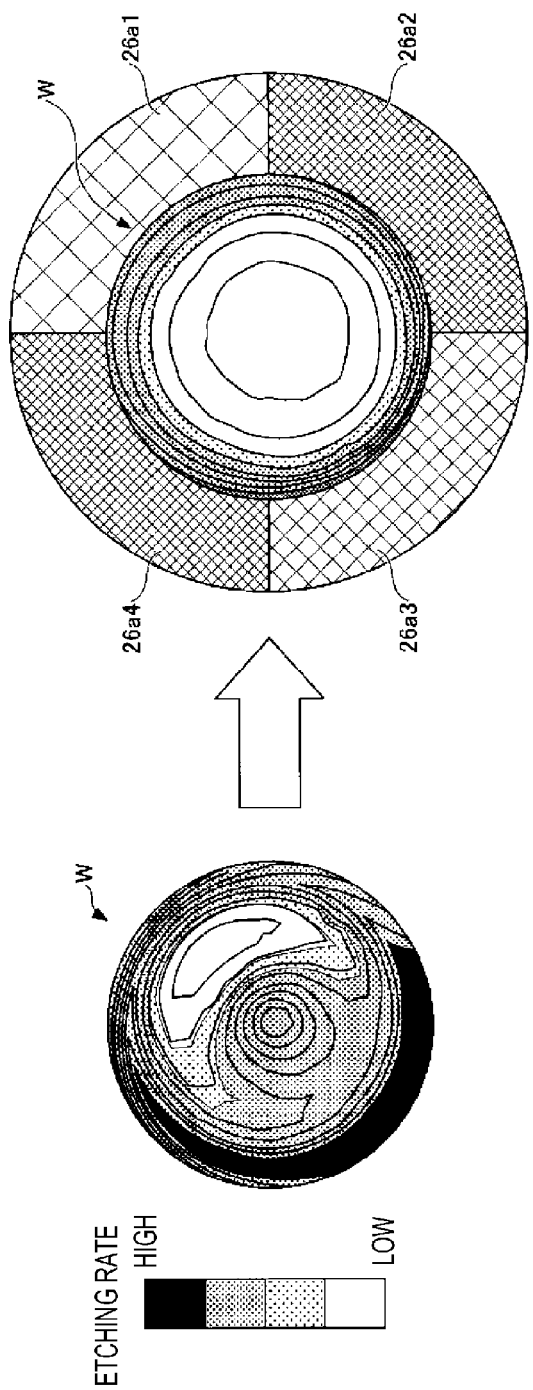

FIG. 9
| FIRST ANNULAR MEMBER | DIELECTRIC CONSTANT | MATERIAL NAME |
|---|---|---|
|  | 13 OR MORE LESS THAN 35 | ZIRCONIA |
| 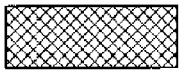 | 7 OR MORE LESS THAN 13 | Si, ALUMINA |
|  | 1 OR MORE LESS THAN 7 | QUARTZ, PEEK, PTFE, CORDIERITE |

ETCHING METHOD AND PLASMA PROCESSING APPARATUS

CROSS-REFERENCE TO RELATED APPLICATIONS

This application is based on and claims priority from Japanese Patent Application No. 2019-123131 filed on Jul. 1, 2019 with the Japan Patent Office, the disclosure of which is incorporated herein in its entirety by reference.

TECHNICAL FIELD

The present disclosure relates to an etching method and a plasma processing apparatus.

BACKGROUND

In a manufacturing process of a semiconductor device, a plasma processing apparatus generates plasma by exciting a processing gas. When performing an etching process on a substrate using generated plasma, demand for in-plane uniformity of etching characteristics is increased.

Japanese Patent Laid-Open Publication No. 2005-277369 discloses a focus ring and a plasma processing apparatus capable of reducing the generation of deposition (byproduct) on a back surface of a peripheral portion of a substrate, in order to improve in-plane uniformity of etching characteristics.

SUMMARY

An aspect of the present disclosure is an etching method performed by a plasma processing apparatus including an annular member around a substrate placed on a support stage. The annular member is divided into a first annular member and a second annular member disposed outside the first annular member. At least a part of the first annular member is disposed in a space between a lower surface of an outer peripheral portion of the substrate and an upper surface of the support stage. The etching method includes: adjusting a dielectric constant in the space by the first annular member in accordance with consumption of the second annular member; and etching the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7A to 7D are views illustrating examples of a plasma control in accordance with consumption of a second annular member according to the embodiment.

FIGS. 8A and 8B are views illustrating a divided structure of an annular member according to a modification 1 of the embodiment.

FIG. 9 is a view illustrating an example of a material of a first annular member according to the modification 1 of the embodiment.

DETAILED DESCRIPTION

Figure 1:
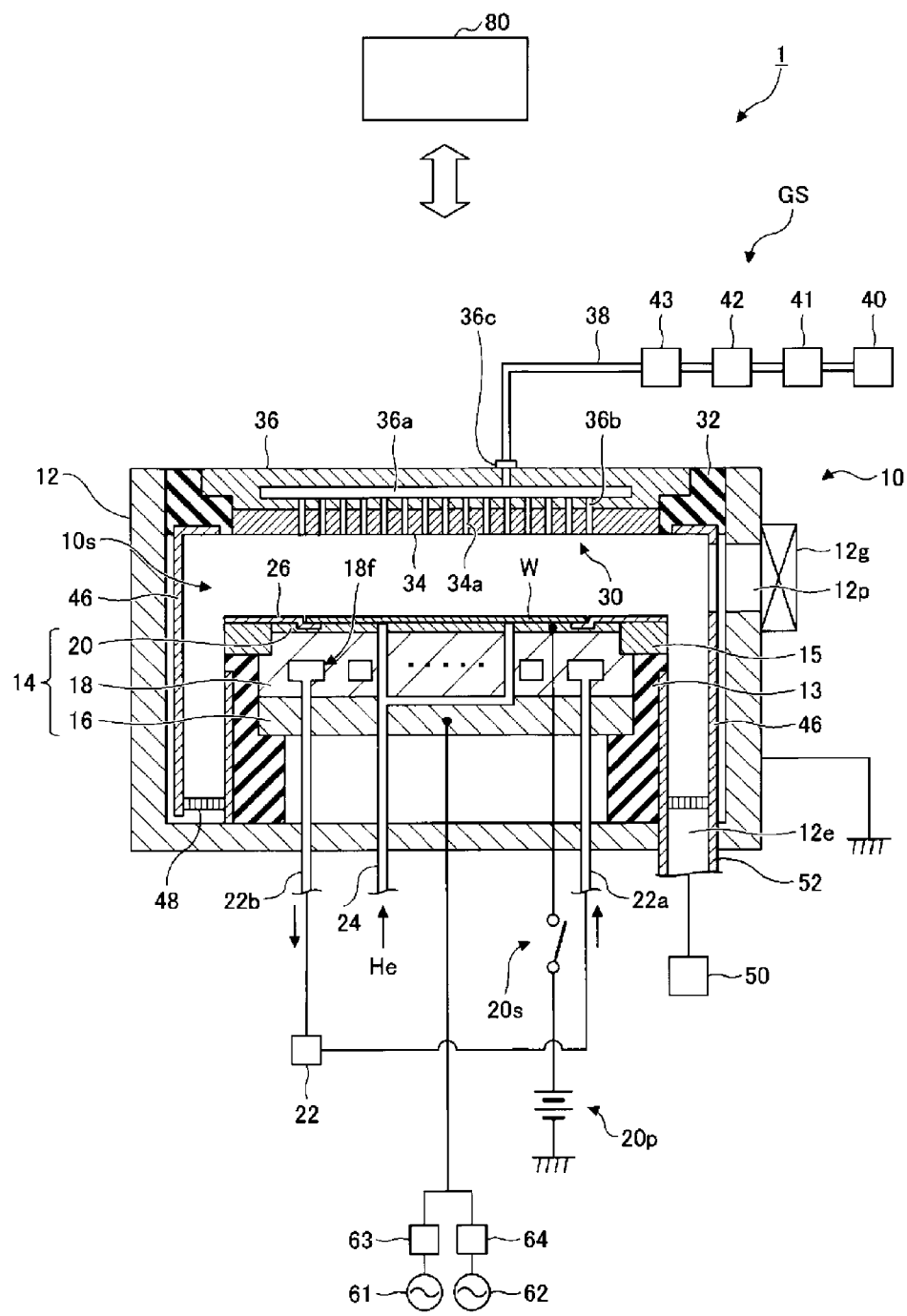
FIG. 1 is a schematic cross-sectional view illustrating an example of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment of the present disclosure will be described with reference to the drawings. In each drawing, the same components may be denoted by the same reference numerals, and duplicate description may be omitted.

[Plasma Processing Apparatus]

A plasma processing apparatus 1 according to an embodiment will be described with reference to FIG. 1. FIG. 1 is a schematic cross-sectional view illustrating an example of the plasma processing apparatus 1 according to the embodiment.

The plasma processing apparatus 1 includes a chamber 10. The chamber 10 provides an internal space 10s therein. The chamber 10 includes a chamber body 12. The chamber body 12 has a substantially cylindrical shape. The chamber body 12 is made of, for example, aluminum. A film having corrosion resistance is provided on an inner wall surface of the chamber body 12. The film may be ceramics such as aluminum oxide or yttrium oxide.

A passage 12p is formed at a side wall of the chamber body 12. A substrate W is transferred between the internal space 10s and the outside of the chamber 10 through the passage 12p. The passage 12p is opened/closed by a gate valve 12g provided along the side wall of the chamber body 12.

A support 13 is provided on the bottom portion of the chamber body 12. The support 13 is made of an insulating material and has a substantially cylindrical shape. The support 13 extends upward from the bottom portion of the chamber body 12 in the internal space 10s. The support 13 includes a support stage 14 on the upper portion. The support stage 14 is configured to support the substrate W in the internal space 10s.

The support stage 14 includes a lower electrode 18 and an electrostatic chuck 20. The support stage 14 may further include an electrode plate 16. The electrode plate 16 is made of a conductor such as aluminum, and has a substantially disc shape. The lower electrode 18 is provided on the electrode plate 16. The lower electrode 18 is made of a conductor such as aluminum, and has a substantially disc shape. The lower electrode 18 is electrically connected to the electrode plate 16.

The electrostatic chuck 20 is provided on the lower electrode 18, and the substrate W is placed on the upper surface of the electrostatic chuck 20. The electrostatic chuck 20 includes a body and an electrode. The body of the electrostatic chuck 20 has a substantially disc shape, and is made of a dielectric. The electrode of the electrostatic chuck 20 is a film-like electrode, and is provided in the body of the electrostatic chuck 20. The electrode of the electrostatic chuck 20 is connected to a DC power source 20p through a switch 20s. When a voltage from the DC power source 20p is applied to the electrode of the electrostatic chuck 20, an electrostatic attractive force is generated between the electrostatic chuck 20 and the substrate W. The substrate W is held on the electrostatic chuck 20 by the electrostatic attractive force.

An annular member 26 is disposed on a periphery of the focus ring FR is disposed on a peripheral portion of the lower electrode 18 to surround an edge of the substrate W. The annular member 26 is also referred to as an edge ring or a focus ring. The annular member 26 improves in-plane uniformity of a plasma processing on the substrate W. The annular member 26 may be made of, for example, silicon, silicon carbide, or quartz. A cover ring 15 is disposed on the support 13 around the annular member 26.

A flow path 18f is provided in the lower electrode 18. A heat exchange medium for temperature adjustment (e.g., a refrigerant) is supplied to the flow path 18f through a pipe 22a from a chiller unit 22 provided outside the chamber 10. The heat exchange medium supplied to the flow path 18f returns to the chiller unit through a pipe 22b. In the plasma processing apparatus 1, the temperature of the substrate W placed on the electrostatic chuck 20 is adjusted by the heat exchange between the heat exchange medium and the lower electrode 18.

A gas supply line 24 is provided in the plasma processing apparatus 1. The gas supply line 24 supplies a heat transfer gas (e.g., helium (He) gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the support stage 14. The upper electrode 30 is supported in the upper portion of the chamber body 12 through a member 32. The member 32 is made of an insulating material. The upper electrode 30 and the member 32 close the upper opening of the chamber body 12.

The upper electrode 30 may include a top plate 34 and a support body 36. A lower surface of the top plate 34 is the lower surface on the internal space 10s side, and defines the internal space 10s. The top plate 34 may be made of a low resistance conductor or semiconductor that generates low Joule heat. The top plate 34 has a plurality of gas discharge holes 34a that penetrates the top plate 34 in a plate thickness direction thereof.

The support body 36 detachably supports the top plate 34. The support body 36 is made of a conductive material such as aluminum. A gas diffusion chamber 36a is provided inside the support body 36. The support body 36 includes a plurality of gas holes 36b that extends downward from the gas diffusion chamber 36a. The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected to a gas supply GS. The gas supply GS includes a gas source group 40, a valve group 41, a flow rate controller group 42, and a valve group 43. The gas source group 40 is connected to the gas supply pipe 38 through the valve group 41, the flow rate controller group 42, and the valve group 43. The gas source group 40 includes a plurality of gas sources. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the corresponding opening/closing valves of the valve group 41, the corresponding flow rate controllers of the flow rate controller group 42, and the corresponding opening/closing valves of the valve group 43.

In the plasma processing apparatus 1, a shield 46 is detachably provided along the inner wall surface of the chamber body 12 and the outer periphery of the support 13. The shield 46 prevents reaction byproducts from being adhered to the chamber body 12. The shield 46 is formed by, for example, forming a film having corrosion resistance on the surface of a base material made of aluminum. The film having corrosion resistance may be made of ceramics such as yttrium oxide.

A baffle plate 48 is provided between the support 13 and the side wall of the chamber body 12. The baffle plate 48 is formed by, for example, forming a film having corrosion resistance (e.g., a film of an yttrium oxide) on the surface of a base material made of aluminum. A plurality of through-holes is formed in the baffle plate 48. An exhaust port 12e is provided at a lower side of the baffle plate 48, and at the bottom portion of the chamber body 12 as well. An exhaust device 50 is connected to the exhaust port 12e through an exhaust pipe 52. The exhaust device 50 includes a vacuum pump such as a pressure adjusting valve and a turbo molecular pump.

The plasma processing apparatus 1 includes a first radio-frequency power source 61 and a second radio-frequency power source 62. The first radio-frequency power source 61 is a power source that generates a first radio-frequency power. The first radio-frequency power has a frequency suitable for plasma generation. The frequency of the first radio-frequency power is, for example, a frequency within a range of 27 MHz to 100 MHz. The first radio-frequency power source 61 is connected to the lower electrode 18 via a matcher 63 and the electrode plate 16. The matcher 63 includes a circuit configured to match the output impedance of the first radio-frequency power source 61 and the impedance of the load side (the lower electrode 18 side). The first radio-frequency power source 61 may be connected to the upper electrode 30 via the matcher 63. The first radio-frequency power source 61 constitutes an example of a plasma generating unit.

The second radio-frequency power source 62 is a power source that generates a second radio-frequency power. The second radio-frequency power has a frequency lower than the frequency of the first radio-frequency power. When the second radio-frequency power is used together with the first radio-frequency power, the second radio-frequency power is used as a radio-frequency power for a bias voltage for drawing ions into the substrate W. The frequency of the second radio-frequency power is, for example, a frequency within a range of 400 kHz to 13.56 MHz. The second radio-frequency power source 62 is connected to the lower electrode 18 via a matcher 64 and the electrode plate 16. The matcher 64 includes a circuit configured to match the output impedance of the second radio-frequency power source 62 and the impedance of the load side (the lower electrode 18 side).

It is possible to generate plasma using the second radio-frequency power without using the first radio-frequency power, that is, using a single radio-frequency power. In this case, the frequency of the second radio-frequency power may be a frequency larger than 13.56 MHz, for example, 40 MHz. Further, in this case, the plasma processing apparatus 1 may not include the first radio-frequency power source 61 and the matcher 63, and the second radio-frequency power source 62 constitutes an example of a plasma generating unit.

In the plasma processing apparatus 1, a gas is supplied to the internal space 10s from the gas supply to generate plasma. Further, a radio-frequency electric field is generated between the upper electrode 30 and the lower electrode 18 by supplying the first radio-frequency power and/or the second radio-frequency power. The generated radio-frequency electric field generates plasma.

The plasma processing apparatus 1 may include a power source connected to the upper electrode 30. The power source applies a voltage for drawing positive ions present in the internal space 10s into the top plate 34 to the upper electrode 30.

The plasma processing apparatus 1 may further include a controller 80. The controller 80 may be a computer including, for example, a processor, a storage unit such as a memory, an input device, a display device, and a signal input/output interface. The controller 80 controls each part of the plasma processing apparatus 1. In the controller 80, an operator may execute an input operation of a command using the input device to manage the plasma processing apparatus 1. Further, in the controller 80, the operation status of the plasma processing apparatus 1 may be visualized and displayed by the display device. Further, a control program and a recipe data are stored in the storage unit. The control program is executed by the processor, in order to execute various processings in the plasma processing apparatus 1. The processor executes the control program, and controls each component of the plasma processing apparatus 1 according to the recipe data.

[Divided Structure of Electrostatic Chuck and Annular Member]

Figure 2:
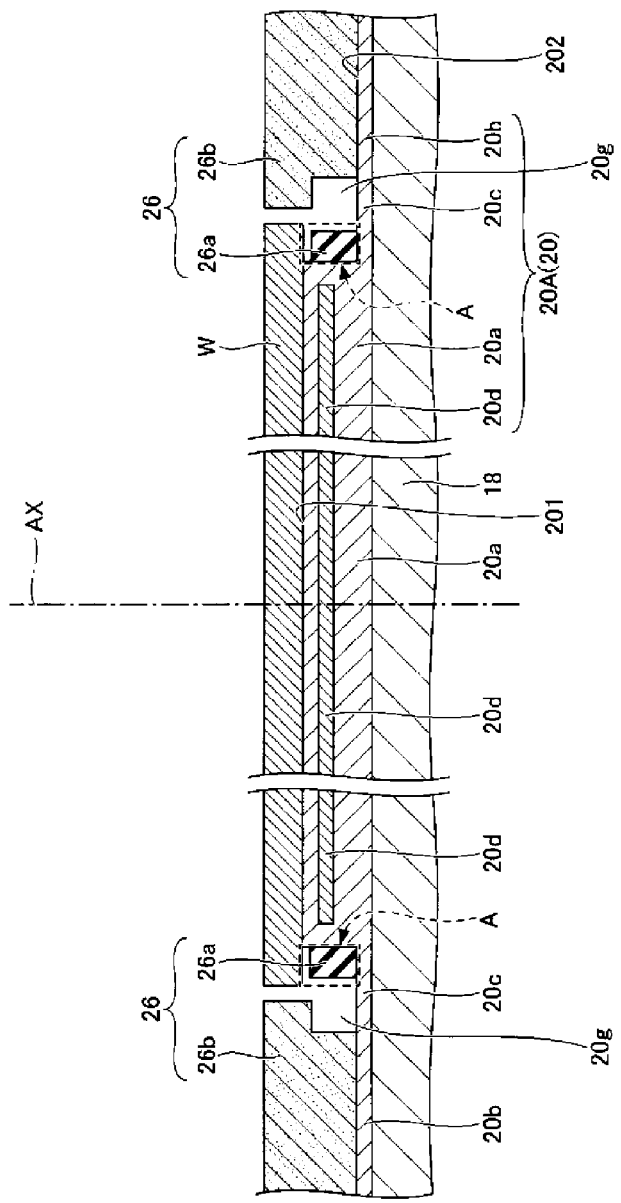
FIG. 2 is a view illustrating a divided structure of an electrostatic chuck and an annular member according to the embodiment.

Hereinafter, descriptions will be made on a divided structure of the electrostatic chuck and the annular member in detail. In the following descriptions, FIG. 2 will be referred together with FIG. 1. FIG. 2 is a view illustrating the divided structure of the electrostatic chuck and the annular member 26 according to the embodiment. FIG. 2 illustrates a state where the annular member 26 is mounted on an electrostatic chuck 20A. The electrostatic chuck 20A illustrated in FIG. 2 may be used as the electrostatic chuck 20 of the plasma processing apparatus 1.

The electrostatic chuck 20A includes a body. The body of the electrostatic chuck 20A has a substantially disc shape. The body of the electrostatic chuck 20A is made of a dielectric material. The body of the electrostatic chuck 20A includes a first area 20a, a second area 20b, and a third area 20c.

The first area 20a is an area having a substantially disc shape. The first area 20a includes a first upper surface 201. The first area 20a is configured to hold the substrate W placed on the first upper surface 201. The diameter of the first area 20a is smaller than the diameter of the substrate W.

The electrostatic chuck 20A further includes an electrode 20d. The electrode 20d is a film type electrode. The electrode 20d is provided in the first area 20a. The electrode 20d is connected to the DC power source 20p through the switch 20s (see FIG. 1). When a voltage from the DC power source 20p is applied to the electrode 20d, an electrostatic attractive force is generated between the first area 20a and the substrate W. By the generated electrostatic attractive force, the substrate W is attracted to the first area 20a, and is held by the first area 20a.

The second area 20b is an area having a ring shape. The second area 20b shares a center axis (an axis AX in FIG. 2) with the first area 20a. The second area 20b extends in a circumferential direction with respect to the center axis so as to surround the first area 20a. The second area 20b includes a second upper surface 202. The second area 20b is configured to support the annular member 26 mounted on the second upper surface 202.

The third area 20c is provided between the first area 20a and the second area 20b. The third area 20c is connected to the first area 20a and the second area 20b so as to integrate the first area 20a, the second area 20b, and the third area 20c. That is, the body of the electrostatic chuck 20A is integrated. The body of the electrostatic chuck 20A, that is, the first area 20a, the second area 20b, and the third area 20c may be made of a single dielectric material. That is, the dielectric material forming the first area 20a, the second area 20b, and the third area 20c may be identical. For example, the body of the electrostatic chuck 20A may be made of ceramics such as aluminum oxide and aluminum nitride. In the electrostatic chuck 20A, the thickness of the second area 20b and the thickness of the third area 20c are equal to each other.

The first area 20a and the second area 20b provide a space 20g between them. The first upper surface 201 and the second upper surface 202 are separated from each other by a space 20g. The space 20g extends in the circumferential direction with respect to the center axis (the axis AX in FIG. 2) of the first area 20a and the second area 20b. The space 20g is a groove in the electrostatic chuck 20A, and is provided between the first area 20a and the second area 20b, and also on the third area 20c. As described above, the diameter of the first area 20a is smaller than the diameter of the substrate W. Therefore, in a state where the substrate W is placed on the first upper surface 201, the edge of the substrate W is positioned on the space 20g. However, the space 20g may not be provided. That is, a step may not be provided on the lower portion of the side surface of the second annular member 26b.

The annular member 26 is a member having a ring shape. The annular member 26 is divided into a first annular member 26a and a second annular member 26b disposed outside the first annular member 26a.

The first annular member 26a and the second annular member 26b have a ring shape. The inner diameter and the outer diameter of the first annular member 26a are smaller than the diameter of the substrate W. The first annular member 26a shares the center axis (the axis AX in FIG. 2) with the second annular member 26b.

In the example in FIG. 2, the first annular member 26a is mounted on the third area 20c of the electrostatic chuck 20A. Further, the first annular member 26a is accommodated in the space 20g provided by the electrostatic chuck 20A. That is, the entire first annular member 26a is disposed in a space A between the lower surface of the outer peripheral portion of the substrate W exposed to the space 20g and the upper surface of the third area 20c. However, at least a part of the first annular member 26a may be disposed in the space A.

Further, in the electrostatic chuck 20, the first area 20a on which the substrate W is placed and the second area 20b on which the second annular member 26b is placed may be separated from each other. In this case, the third area 20c is provided on the outer peripheral side of the first area 20a and the inner peripheral side of the second area 20b, or on the inner peripheral side of the second area 20b. In this case, at least a part of the first annular member 26a is disposed in a space A between the lower surface of the outer peripheral portion of the substrate W and the upper surface of the lower electrode 18.

The material of the first annular member 26a may be any one of quartz, ceramics, resin, silicon, or silicon carbide, but is not limited thereto. When the material of the first annular member 26a is ceramics, the first annular member 26a may be any one of alumina, zirconia, or cordierite. When the material of the first annular member 26a is resin, the first annular member 26a may be any one of polytetrafluoroethylene (PTFE) or polyether ether ketone (PEEK).

The second annular member 26b is mounted on the second area 20b of the electrostatic chuck 20A. The material of the second annular member 26b may be made of any one of silicon, silicon carbide, and quartz, but is not limited thereto. The substrate W is placed on the electrostatic chuck 20A such that the edge area thereof is positioned on the first annular member 26a. The end surface of the substrate W is positioned outside the outer end surface of the first annular member 26a, but the present disclosure is not limited thereto. The end surface of the substrate W may be the same as the outer end surface of the first annular member 26a or positioned inside the outer end surface of the first annular member 26a.

It is found that the impedance in the space A affects the plasma density in the outer peripheral portion of the substrate W. For example, in the integrated annular member 27 illustrated in FIG. 5A, it is difficult to control the etching characteristics of only the outer peripheral portion of the substrate W.

Meanwhile, the annular member 26 of the plasma processing apparatus 1 according to the present embodiment includes a structure in which the first annular member 26a separated from the second annular member 26b is accommodated in the space A between the lower surface of the outer peripheral portion of the substrate W and the upper surface of the electrostatic chuck 20 illustrated in FIG. 2. Then, in order to improve the etching characteristics in the outer peripheral portion of the substrate W, the dielectric constant of the first annular member 26a is optimized, and the impedance in the space A below the substrate W is optimized. Therefore, the etching characteristics of the outermost periphery of the substrate W are improved by controlling the plasma density in the outer peripheral portion of the substrate W. Therefore, it is possible to improve the in-plane uniformity of the etching of the substrate W.

Figure 3:
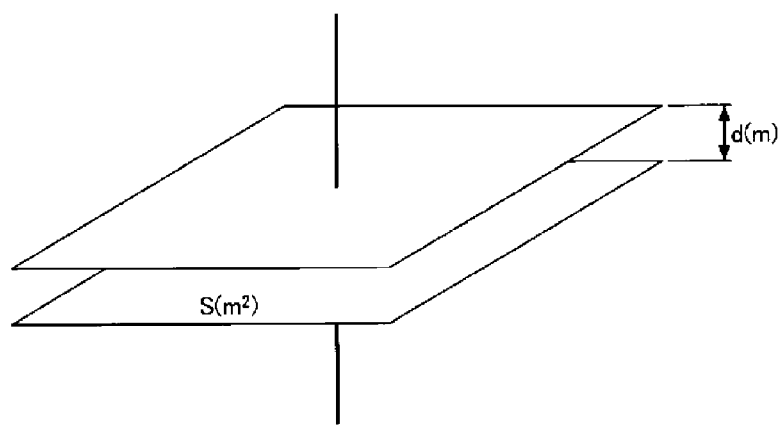
FIG. 3 is a view for explaining adjustment of impedance.

Here, descriptions will be made on the adjustment of the impedance by the first annular member 26a with reference to FIG. 3. When assuming that the distance between the first annular member 26a and the substrate W (a distance of a vacuum section) is d (m), the surface area of the first annular member 26a is S (m$^2$), the dielectric constant of the first annular member 26a is $\varepsilon_r$ (F/m), and the dielectric constant of the vacuum is $\varepsilon_0$ (F/m), the following equation (1) is established.

$$C = \varepsilon_0 \times \varepsilon_r \times S/d \quad (1)$$

C(F) is the capacitance in the space A between the lower surface of the outer peripheral portion of the substrate W and the upper surface of the third area 20c of the electrostatic chuck 20. It is possible to calculate the impedance in the space A from the equations (1) and (2).

$$\dot{Z} = -\frac{1}{C\omega} j \quad (2)$$

According to the equation (2), the larger the capacitance C, the smaller the impedance, and the smaller the capacitance C, the larger the impedance. Therefore, from the equations (1) and (2), it is possible to adjust the impedance in the space A by adjusting the dielectric constant $\varepsilon_r$ of the first annular member 26a. For example, a plurality of first annular members 26a made of different materials is provided, and any one of the first annular members 26a is appropriately disposed in the space A. When reducing the dielectric constant $\varepsilon_r$ of the first annular member 26a, the capacitance C is reduced, and the impedance in the space A is increased. Therefore, it is possible to decrease the plasma density in the outer peripheral portion of the substrate W. On the contrary, when increasing the dielectric constant $\varepsilon_r$ of the first annular member 26a, the capacitance C is increased, and the impedance in the space A is reduced. Therefore, it is possible to increase the plasma density in the outer peripheral portion of the substrate W. From the above, it is possible to control the plasma density in the outer peripheral portion of the substrate W by disposing the first annular member 26a in the space A in accordance with the conditions of the process and the consumption of the second annular member 26b, among the plurality of first annular members 26a made of different materials. Therefore, it is possible to control the etching characteristics in the outer peripheral portion of the substrate W.

The thickness "d" in the equation (1) is a distance between the substrate W and the first annular member 26a (a distance of a vacuum section). Therefore, it is possible to adjust the impedance in the space A by also adjusting the thickness of the first annular member 26a. For example, it is possible to control the distance between the outer peripheral portion of the substrate W and the first annular member 26a by disposing any one of the first annular member 26a in the space A, among the plurality of first annular members 26a having different thicknesses. For example, the distance d is reduced by increasing the thickness of the first annular member 26a, and thus, the capacitance C is increased. Therefore, the impedance in the space A is reduced, and the plasma density in the outer peripheral portion of the substrate W may be increased. On the contrary, the distance d is increased by reducing the thickness of the first annular member 26a, and thus, the capacitance C is reduced. Therefore, the impedance in the space A is increased, and the plasma density in the outer peripheral portion of the substrate W may be decreased. From the above, it is possible to control the etching characteristics in the outer peripheral portion of the substrate W by changing the material and/or the thickness of the first annular member 26a.

In the above, the method in which the dielectric constant in the space A is adjusted by disposing the first annular member 26a made of different materials and/or having different thicknesses in the space A, whereby controlling the plasma density in the outer peripheral portion of the substrate W and etching the substrate W has been described. Therefore, it is possible to improve the in-plane uniformity of the etching characteristics. The adjustment method of the dielectric constant in the space A is not limited thereto, and at least one of the material, the thickness, and the shape of the first annular member 26a may be changed to adjust the dielectric constant in the space A.

[Influence According to Consumption of Second Annular Member]

Figure 4A:
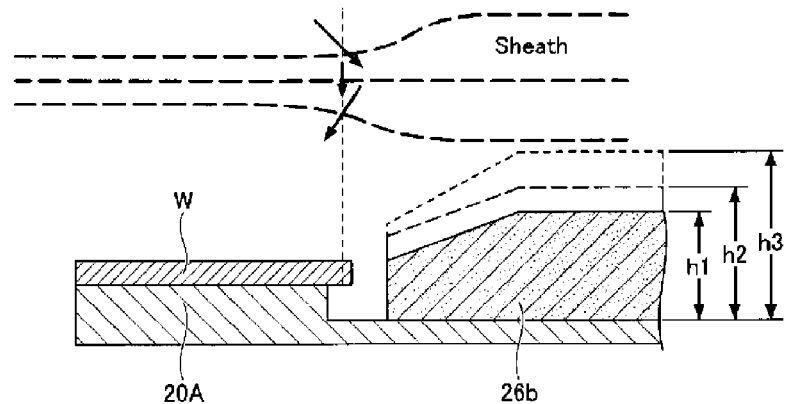
FIGS. 4A to 4C are views illustrating examples of a plasma control by the divided structure of the annular member according to the embodiment.
Figure 4B:
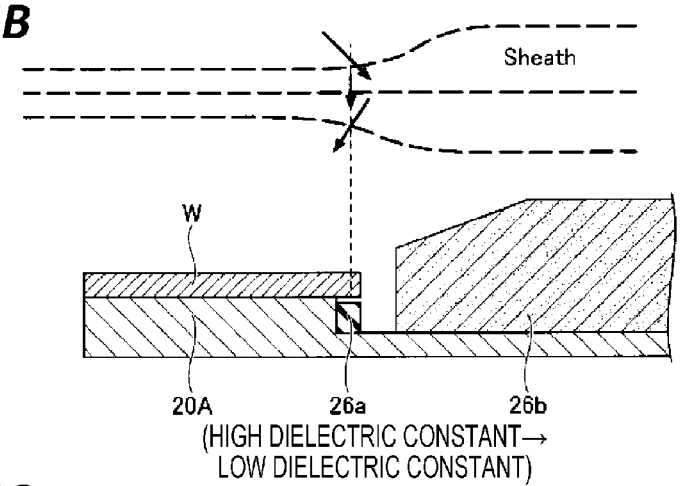
Figure 4C:
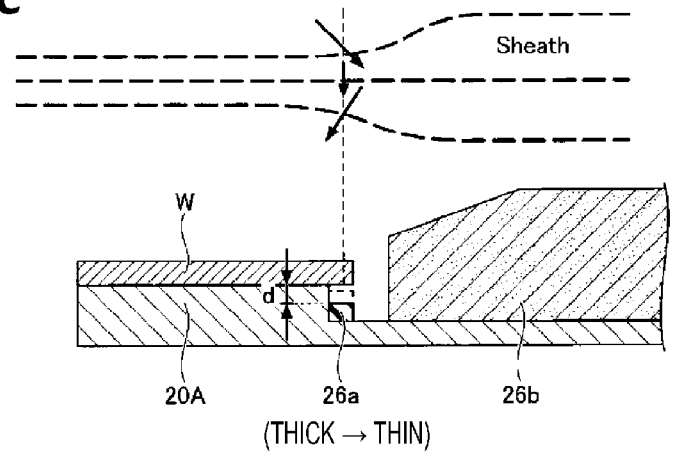

Next, descriptions will be made on an example of the plasma control by the consumption of the second annular member and the first annular member with reference to FIGS. 4A to 4C. FIGS. 4A to 4C are drawings illustrating an example of the plasma control by the consumption of the second annular member 26b and the first annular member 26a.

When the thickness of the second annular member 26b is consumed in the order of h3, h2, and h1 (h3>h2>h1) illustrated in FIG. 4A, the thickness of a sheath on the second annular member 26b at the time of plasma generation becomes thinner in the order of h3, h2, and h1.

For example, in the example in FIG. 4A, when the thickness of the second annular member 26b is h3, the sheath on the second annular member 26b becomes thicker than the sheath on the substrate W, and ions in the plasma are obliquely incident from the inner side to the outer side on the outer peripheral portion of the substrate W. As a result, tilting in which the etching shape of, for example, holes formed in the outer peripheral portion of the substrate W is inclined from the inner side to the outer side with respect to the vertical occurs.

When the thickness of the second annular member 26b is h2, the sheath on the second annular member 26b has the same thickness as that of the sheath on the substrate W, and ions are vertically incident on the outer peripheral portion of the substrate W. As a result, the etching shape formed in the outer peripheral portion of the substrate W is vertical.

When the thickness of the second annular member 26b is h1, the sheath on the second annular member 26b becomes thinner than the sheath on the substrate W, and ions in the plasma are obliquely incident from the outer side to the inner side on the outer peripheral portion of the substrate W. As a result, tilting in which the etching shape of, for example, holes formed in the outer peripheral portion of the substrate W is inclined from the outer side to the inner side with respect to the vertical occurs.

Therefore, the tilting in which the etching shape is inclined from the outer side to the inner side, or from the inner side to the outer side with respect to the vertical may be prevented by adjusting the dielectric constant in the space A using the first annular member in accordance with the consumption of the second annular member 26b, and performing the etching of the substrate W.

For example, as illustrated in FIG. 4B, the first annular member 26a of a high dielectric constant material is changed to the first annular member 26a of a low dielectric constant material, in accordance with the height of the second annular member 26b. Then, based on the equations (1) and (2), the capacitance C is reduced, and the impedance is changed from a low state to a high state. Then, the loss of the first radio-frequency power supplied to the plasma increases. As a result, the sheath is changed from a thick state to a thin state, and the plasma density is changed from a high state to a low state. Therefore, it is possible to prevent tilting in which the etching shape is inclined by a predetermined angle with respect to the vertical by disposing the first annular member 26a having the dielectric constant $\varepsilon_r$ at which the sheath on the substrate W has the same thickness as that of the sheath on the second annular member 26b in the space A to adjust the dielectric constant in the space A.

Further, for example, as illustrated in FIG. 4C, the thickness of the first annular member 26a may be changed, in accordance with the height of the second annular member 26b. The thickness of the first annular member 26a is changed from a thick state to a thin state. Then, the distance d between the lower surface of the substrate W and the upper surface of the first annular member 26a illustrated in FIG. 4C increases. Therefore, based on the equations (1) and (2), the capacitance C is reduced, and the impedance is changed from a low state to a high state. Also in this case, the sheath is changed from a thick state to a thin state, and the plasma density is changed from a high state to a low state.

Figure 5A:
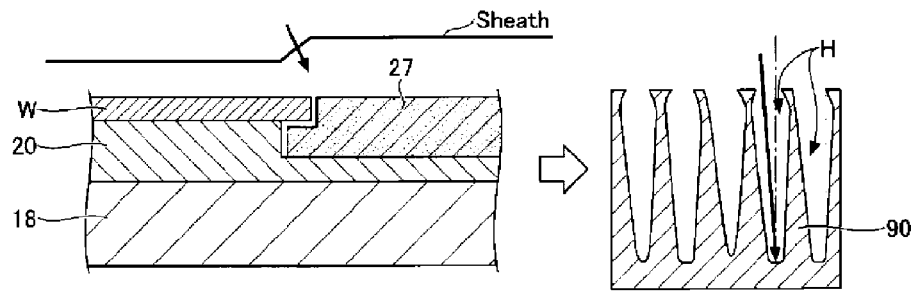
FIGS. 5A to 5C are views illustrating examples of a measurement result of a tilting angle by the divided structure of the annular member according to the embodiment.
Figure 5B:
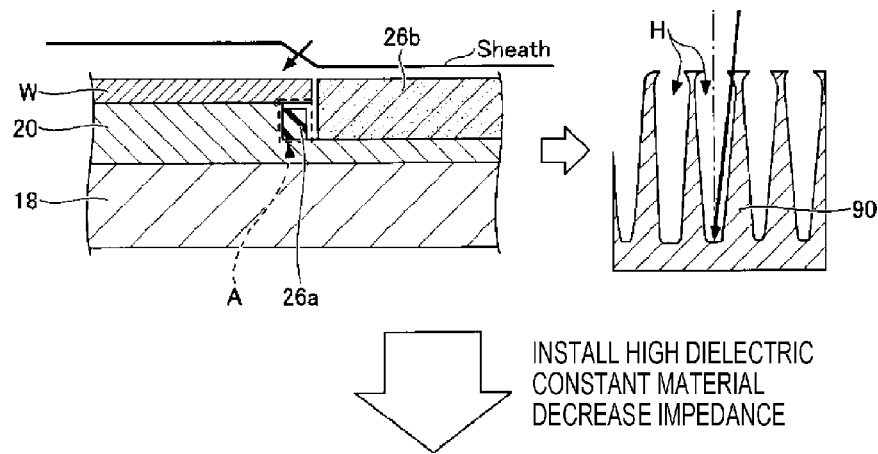
Figure 5C:
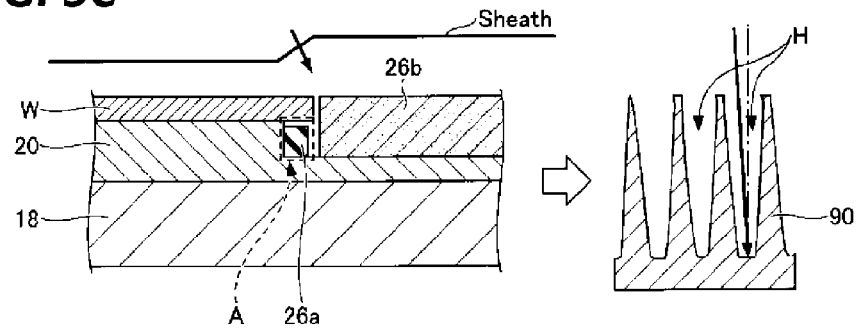

FIGS. 5A to 5C are views illustrating examples of a measurement result of a tilting angle by the divided structure of the annular member according to the embodiment. FIG. 5A illustrates an example of a cross section of holes H formed in a film 90 when performing etching using the integrated annular member 27 that does not have a divided structure as a comparative example. In the example in FIG. 5A, the sheath on the integrated annular member 27 becomes thicker than the sheath on the substrate W. In this case, ions are incident from the inner side to the outer side on the outer peripheral portion of the substrate W. As a result, tilting inclined from the inner side to the outer side as illustrated in the vertical cross-sectional view of the film 90 occurs in the holes H formed in the outer peripheral portion of the substrate W.

Meanwhile, in FIG. 5B, in the annular member 26 having the divided structure according to the present embodiment, the first annular member 26a of a low dielectric constant material is disposed in the space A. Therefore, since the impedance becomes a higher state, the sheath becomes thinner, and the plasma density becomes a lower state. Therefore, the sheath on the substrate W becomes thicker than the sheath on the second annular member 26b. As a result, tilting inclined from the outer side to the inner side as illustrated in the vertical cross-sectional view of the film 90 occurs in the holes H formed in the outer peripheral portion of the substrate W.

In FIG. 5C, in the annular member 26, the first annular member 26a of high dielectric constant material having a dielectric constant $\varepsilon_r$ higher than the low dielectric constant material in the case of FIG. 5B is disposed again in the space A. Therefore, since the impedance becomes a lower state, the sheath becomes thicker, and the plasma density becomes a higher state. Therefore, the sheath on the substrate W becomes thinner than the sheath on the second annular member 26b. As a result, tilting inclined from the inner side to the outer side as illustrated in the vertical cross-sectional view of the film 90 occurs in the holes H formed in the outer peripheral portion of the substrate W. From the above, it is proved that the tilting angle may be changed by varying the dielectric constant of the first annular member 26a. In FIGS. 5B and 5C, a step is not provided in the lower portion of the side surface of the second annular member 26b. However, as illustrated in FIG. 2, the space 20g may be provided in the lower portion of the side surface of the second annular member 26b.

FIGS. 6A to 6D are views illustrating examples of a plasma control in accordance with the consumption of the second annular member according to the embodiment. FIGS. 6A to 6D illustrate the sheath and the tilting angle when adjusting the dielectric constant of the first annular member 26a in accordance with the consumption of the second annular member 26b.

Figures 6A, 6B, 6C, 6D:
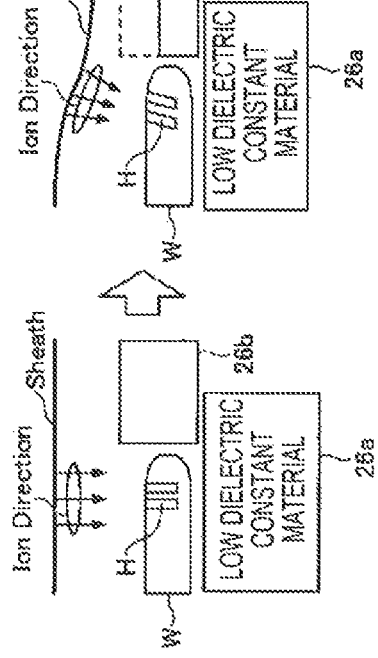
FIGS. 6A to 6D are views illustrating examples of a plasma control in accordance with consumption of a second annular member according to the embodiment.

In FIG. 6A, the first annular member 26a of a low dielectric constant material is disposed in the vicinity of the outer peripheral portion of the substrate W such that at least a part thereof is accommodated in the space A. At this time, the second annular member 26b is not consumed, and the sheath on the substrate W and the sheath on the second annular member 26b have the same thickness. In this case, the holes H formed in the outer peripheral portion of the substrate W are vertically etched.

In FIG. 6B, the second annular member 26b is consumed, and becomes thinner than that of the case in FIG. 6A. At this time, the sheath on the second annular member 26b becomes thinner than the sheath on the substrate W. As a result, the incident angle of ions is inclined from the outer side to the inner side, and the holes H formed in the outer peripheral portion of the substrate W have the tilting angle inclined from the outer side to the inner side.

As illustrated in FIG. 6C, the first annular member 26a is changed from a low dielectric constant material to a high dielectric constant material. Then, the impedance is reduced, and the sheath on the second annular member 26b becomes thicker than the sheath on the substrate W. As a result, the incident angle of ions is inclined from the inner side to the outer side, and in the holes H formed in the outer peripheral portion of the substrate W, the tilting angle is changed to the direction opposite to that in FIG. 6B.

In FIG. 6D, the second annular member 26b is consumed more than in FIG. 6C. At this time, the sheath on the second annular member 26b becomes thinner again than the sheath on the substrate W. As a result, in the holes H formed in the outer peripheral portion of the substrate W, the incident angle of ions is inclined from the outer side to the inner side, and in the holes H formed in the outer peripheral portion of the substrate W, the tilting angle is changed to the direction opposite to that in FIG. 6C.

By performing the control illustrated in FIGS. 6A to 6D described above, for example, in the initial state (in which the second annular member 26b is not consumed), the first annular member 26a having an appropriate dielectric constant smaller than that of the second annular member 26b is combined. Therefore, the thickness of the sheath on the second annular member 26b and the thickness of the sheath on the substrate W may be equal. The thickness of the second annular member 26b becomes thinner as the second annular member 26b is consumed, but the first annular member 26a is changed to the first annular member 26a having an appropriate dielectric constant higher than that of the already installed first annular member 26a before the tilting angle exceeds a certain threshold. Therefore, it is possible to improve the tilting by returning the thickness of the sheath to be uniform. As compared with the case of the integral type, it is possible to suppress the tilting within a range of an allowable value for a long period of time by changing the first annular member 26a, and thus, the in-plane uniformity of the etching characteristics is maintained for a long period of time.

FIGS. 7A to 7D are views illustrating examples of a plasma control in accordance with the consumption of the second annular member according to the embodiment. FIGS. 7A to 7D illustrate the sheath and the tilting angle when adjusting the thickness of the first annular member 26a in accordance with the consumption of the second annular member 26b.

In FIG. 7A, the first annular member 26a having a predetermined thickness is disposed. At this time, the second annular member 26b is not consumed, and thus, the sheath on the substrate W and the sheath on the second annular member 26b have the same thickness. In this case, the holes H formed in the outer peripheral portion of the substrate W are vertically etched.

In FIG. 7B, the second annular member 26b is consumed, and becomes thinner than that of the case in FIG. 7A. At this time, the sheath on the second annular member 26b becomes thinner than the sheath on the substrate W. As a result, the incident angle of ions is inclined from the outer side to the inner side, and the holes H formed in the outer peripheral portion of the substrate W have the tilting angle inclined from the outer side to the inner side.

As illustrated in FIG. 7C, the first annular member 26a having a thickness larger than that of the first annular member 26a in FIG. 7B is used. Then, the impedance is reduced, and the sheath on the second annular member 26b becomes thicker than the sheath on the substrate W. As a result, the incident angle of ions is inclined from the inner side to the outer side, and in the holes H formed in the outer peripheral portion of the substrate W, the tilting angle is changed to the direction opposite to that in FIG. 7B.

In FIG. 7D, the second annular member 26b is consumed more than in FIG. 7C. At this time, the sheath on the second annular member 26b becomes thinner again than the sheath on the substrate W. As a result, in the holes H formed in the outer peripheral portion of the substrate W, the incident angle of ions is inclined from the outer side to the inner side, and in the holes H formed in the outer peripheral portion of the substrate W, the tilting angle is changed to the direction opposite to that in FIG. 7C.

By performing the control illustrated in FIGS. 7A to 7D described above, for example, in the initial state (in which the second annular member 26b is not consumed), the first annular member 26a having an appropriately thin thickness is combined. Therefore, the thickness of the sheath on the second annular member 26b and the thickness of the sheath on the substrate W may be equal. The thickness of the second annular member 26b becomes thinner as the second annular member 26b is consumed, but the first annular member 26a is changed to the appropriate first annular member 26a having the thickness thicker than that of the already installed first annular member 26a before the tilting angle exceeds a certain threshold. Therefore, it is possible to improve the tilting by returning the thickness of the sheath to be uniform. As compared with the case of the integral type, it is possible to suppress the tilting within a range of an allowable value for a long period of time by changing the first annular member 26a, and thus, the in-plane uniformity of the etching characteristics is maintained for a long period of time.

In the above, the etching method in which the consumption of the second annular member 26b is measured, and the processing of adjusting the dielectric constant in the space A using the first annular member 26a in accordance with the measured consumption of the second annular member 26b, and the processing of etching the substrate W has been described. According to this, it is possible to control the tilting angle in accordance with the consumption of the second annular member 26b. Therefore, it is possible to control the etching characteristics in the outer peripheral portion of the substrate W. As a result, the in-plane uniformity of the etching of the substrate W may be promoted, and thus, the life of the second annular member 26b may be extended.

[Modification 1]

Next, descriptions will be made on a divided structure of an annular member 26 according to a modification 1 of the embodiment with reference to FIGS. 8A and 8B, and FIG.

9. FIGS. 8A and 8B are views illustrating a divided structure of an annular member according to the modification 1 of the embodiment. FIG. 9 is a view illustrating an example of a material of the first annular member according to the modification 1 of the embodiment.

FIG. 8A illustrates an example of the result of measuring the distribution of the in-plane etching rate of the substrate W. As illustrated in FIG. 8A, a portion having a high etching rate and a portion having a low etching rate exist in the outer peripheral portion of the substrate W in the circumferential direction.

Therefore, as illustrated in FIG. 8B, in the divided structure of the annular member 26 according to the modification 1 of the embodiment, the first annular member 26a is divided into four pieces in the circumferential direction. For example, a first annular member 26a1 is an area having the lowest etching rate in the outer peripheral portion of the substrate W, and thus, as illustrated in FIG. 9, is made of a material having a dielectric constant $\varepsilon_r$ of about 30. Examples of a material having a dielectric constant $\varepsilon_r$ of about 30 may include zirconia. Therefore, it is possible to relatively increase the plasma density in the vicinity of the outer peripheral portion of the substrate W corresponding to the first annular member 26a1.

Since a first annular member 26a3 is an area having the highest etching rate in the outer peripheral portion of the substrate W, the annular member containing a material having a dielectric constant lower than that of the second annular member 26b is selected in order to decrease the etching rate. For example, when the second annular member 26b is silicon, as illustrated in FIG. 9, a material having a dielectric constant $\varepsilon_r$ of 1 or more and less than 7 is selected. Examples of a material having a dielectric constant $\varepsilon_r$ of 1 or more and less than 7 may include quartz, PEEK, or PTFE. Therefore, it is possible to relatively decrease the plasma density in the vicinity of the outer peripheral portion of the substrate W corresponding to the first annular member 26a3, and thus, the etching rate may be reduced.

On the contrary, a first annular member 26a1 is the area having the lowest etching rate in the outer peripheral portion of the substrate W, the annular member containing a material having a dielectric constant higher than that of the second annular member 26b is selected in order to increase the etching rate. For example, when the second annular member 26b is silicon, as illustrated in FIG. 9, a material having a dielectric constant $\varepsilon_r$ of 13 or more and less than 35 is selected. Examples of a material having a dielectric constant $\varepsilon_r$ of 13 or more and less than 35 may include zirconia. Therefore, it is possible to relatively increase the plasma density in the vicinity of the outer peripheral portion of the substrate W corresponding to the first annular member 26a1, and thus, the etching rate may be increased.

Since first annular members 26a2 and 26a4 are areas having an intermediate etching rate in the outer peripheral portion of the substrate W, the annular member containing a material having a dielectric constant similar to that of the second annular member 26b is selected in order to maintain the etching rate. For example, when the second annular member 26b is silicon, as illustrated in FIG. 9, a material having a dielectric constant $\varepsilon_r$ of 7 or more and less than 13 is selected. Examples of a material having a dielectric constant $\varepsilon_r$ of 7 or more and less than 13 may include silicon (Si) or alumina. Therefore, it is possible to relatively decrease the plasma density in the vicinity of the outer peripheral portion of the substrate W corresponding to the first annular members 26a2 and 26a4, and thus, the etching rate may be maintained. The second annular member 26b is not limited to silicon.

As described above, according to the etching characteristics such as the etching rate of the substrate W, the first annular member 26a is further divided in the circumferential direction, and the dielectric constant in the space A is adjusted in the circumferential direction. Therefore, the etching characteristics in the outer peripheral portion of the substrate may be further improved, and thus, the in-plane uniformity such as the etching rate may be increased.

In the modification 1, for the first annular member 26a, the example in which the plurality of first annular members 26a having different dielectric constants $\varepsilon_r$ are divided into four pieces in the circumferential direction according to the etching characteristics in the outer peripheral portion of the substrate W. However, the present disclosure is not limited thereto, and the first annular member 26a may be divided into two or more pieces in the circumferential direction. Further, the division of the first annular member 26a in the circumferential direction may be equally divided, or may be divided into different sizes according to the etching characteristics. However, the first annular members 26a adjacent to each other are different in at least one of a material, a thickness, and a shape. Further, the dielectric constant in the space A may be adjusted by the first annular member 26a by combining the etching characteristics in the outer peripheral portion of the substrate W and the consumption of the second annular member 26b.

[Modification 2]

Figure 10A:
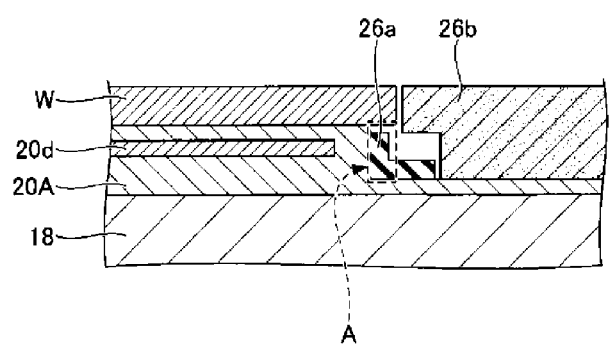
FIGS. 10A and 10B are views illustrating a divided structure of an annular member according to a modification 2 of the embodiment.
Figure 10B:
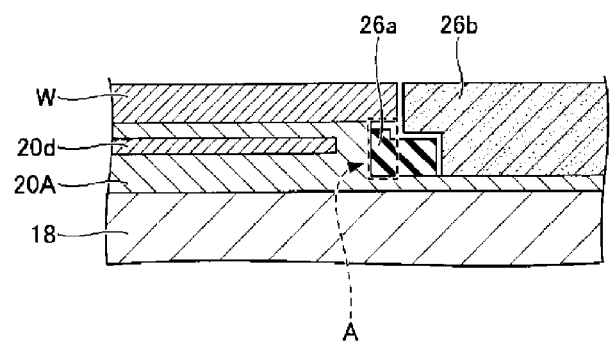

Next, descriptions will be made on a divided structure of an annular member 26 according to a modification 2 of the embodiment with reference to FIGS. 10A and 10B. FIGS. 10A and 10B are views illustrating an annular member according to the modification 2 of the embodiment.

The annular member 26 according to the modification 2 of the embodiment illustrated in FIGS. 10A and 10B includes a first annular member 26a and a second annular member 26b, and the cross section of the first annular member 26a in the radial direction has a L-shape. That is, in the modification 2, a part of the first annular member 26a is accommodated in the space A, and the rest parts thereof are disposed outside the space A.

The vertical thickness of the portion of the annular member 26a illustrated in FIG. 10A disposed outside the space A is thinner than that of the first annular member 26a illustrated in FIG. 10B. However, the present disclosure is not limited thereto. The lateral lengths of the portion of the first annular member 26a disposed outside the space A may be different from each other, and the lateral thicknesses or the vertical lengths of the portion of the first annular member 26a accommodated in the space A may be different from each other. Further, the first annular member 26a may be divided into a plurality of pieces in the circumferential direction.

As described above, in the embodiment, the annular member 26 is divided into two pieces of the first annular member 26a and the second annular member 26b, but may be divided into three or more pieces. A processing of adjusting the dielectric constant in the space A may adjust the ratio of the dielectric constant of the first annular member 26a with respect to the dielectric constant of the second annular member 26b. The dielectric constant $\varepsilon_r$ or the thickness of the first annular member 26a may be changed according to at least one of a recipe, a process condition, or consumption of the second annular member 26b.

Therefore, the impedance in the space A may be optimized, and the etching characteristics in the outer peripheral portion of the substrate W may be adjusted. Therefore, the in-plane etching uniformity of the substrate W is promoted, and the etching of the outermost periphery of the substrate W may be improved. Further, the first annular member 26a may be divided in the circumferential direction, and the dielectric constant of the plurality of first annular members 26a divided in the circumferential direction according to the etching characteristics in the outer peripheral portion of the substrate W. Therefore, it is possible to further improve the in-plane uniformity of the etching of the substrate W.

The etching method using the annular member 26 of the embodiment and the modifications 1 and 2 described above may be performed by controlling each component of the plasma processing apparatus 1 with the controller 80.

The plasma processing apparatus of the present disclosure may be applied to any type of the apparatus of an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

According to an aspect, it is possible to improve the etching characteristics in the outer peripheral portion of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching, comprising:
providing a plasma processing apparatus including a first annular member disposed around a substrate placed on a support stage, and a second annular member disposed outside the first annular member, at least a part of the first annular member being disposed in a space between a lower surface of an outer peripheral portion of the substrate and an upper surface of the support stage;
determining a consumption of the second annular member;
adjusting a dielectric constant in the space by making an adjustment of the first annular member in response to the consumption of the second annular member determined in the determining step; and
etching the substrate.

2. The method according to claim 1, wherein the adjusting the dielectric constant in the space is performed by changing a dielectric constant of the first annular member with respect to a dielectric constant of the second annular member.

3. The method of claim 1, wherein an inner circumference of the second annular member is radially outside of an outer circumference of the first annular member.

4. The method of claim 1, wherein the consumption of the second annular member is determined by measuring the consumption, and the adjusting of the dielectric constant is in response to measuring the consumption.

5. The method of claim 1, wherein etching is performed with the first annular member and the second annular member before the determining the consumption;
in the determining the consumption, the consumption of the second annular member is determined to be sufficient to change a tilt angle of holes formed in the substrate; and
the adjusting of the dielectric constant suppresses changes in the tilt angle.

6. The method of claim 1, wherein etching is performed with the first annular member and the second annular member before the determining the consumption;
in the determining the consumption, the consumption of the second annular member is determined to be sufficient to change a sheath thickness above the second annular member and increase a sheath thickness difference between the sheath thickness above the second annular member and a sheath thickness above an outer periphery of the substrate; and
the adjusting of the dielectric constant suppresses increases in the sheath thickness difference.

7. The method according to claim 1, wherein etching is performed with the first annular member and the second annular member before the determining the consumption; and
after the determining the consumption, the adjusting is performed by replacing the first annular member with a replacement first annular member while retaining a same second annular member, and thereafter etching is performed with the replacement first annular member and the same second annular member.

8. The method according to claim 1, wherein the first annular member is made one of quartz, ceramics, resin, silicon, or silicon carbide.

9. The method according to claim 8, wherein the ceramics is any one of alumina, zirconia, or cordierite.

10. The method according to claim 1, wherein the first annular member is divided into a plurality of pieces in a circumferential direction, and the dielectric constant in the space is adjusted in the circumferential direction.

11. The method according to claim 10, wherein first annular members adjacent to each other are different in at least one of a material, a thickness, and a shape.

12. The method according to claim 10, wherein a plurality of first annular members having different dielectric constants are disposed in the circumferential direction according to etching characteristics in the outer peripheral portion of the substrate.

13. The method according to claim 1, wherein the adjusting the dielectric constant in the space is performed by changing at least one of material, thickness, and shape of the first annular member.

14. The method according to claim 13, wherein the adjusting the dielectric constant in the space is performed by changing a dielectric constant of the first annular member with respect to a dielectric constant of the second annular member.

15. The method according to claim 14, wherein the first annular member is divided into a plurality of pieces in a circumferential direction, and the dielectric constant in the space is adjusted in the circumferential direction.

16. The method according to claim 15, wherein first annular members adjacent to each other are different in at least one of a material, a thickness, and a shape.

17. The method according to claim 16, wherein a plurality of first annular members having different dielectric constants are disposed in the circumferential direction according to etching characteristics in the outer peripheral portion of the substrate.

18. The method according to claim 17, wherein the first annular member is made of any one of quartz, ceramics, resin, silicon, or silicon carbide.

19. The method according to claim 18, wherein the ceramics is any one of alumina, zirconia, or cordierite.

20. A plasma processing apparatus comprising:
a processing chamber including a support stage configured to accommodate a substrate;
a first annular member disposed around the substrate, at least a part of the first annular member being disposed in a space between a lower surface of an outer peripheral portion of the substrate and an upper surface of the support stage;
a second annular member disposed outside the first annular member; and
a controller configured to determine a consumption of the second annular member, to adjust a dielectric constant in the space by making an adjustment of the first annular member in response to the determined consumption of the second annular member, and to etch the substrate.

* * * * *